(12) United States Patent
Nomoto et al.

(10) Patent No.: US 6,461,917 B2
(45) Date of Patent: Oct. 8, 2002

(54) MEMORY DEVICE, MANUFACTURING METHOD THEREOF AND INTEGRATED CIRCUIT THEREOF

(75) Inventors: Kazumasa Nomoto; Dharam Pal Gosain; Setsuo Usui; Takashi Noguchi, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/888,862

(22) Filed: Jun. 25, 2001

(65) Prior Publication Data

US 2001/0044185 A1 Nov. 22, 2001

Related U.S. Application Data

(62) Division of application No. 09/404,479, filed on Sep. 24, 1999, now Pat. No. 6,274,903.

(30) Foreign Application Priority Data

Sep. 29, 1998 (JP) .......................................... 10-274983

(51) Int. Cl.[7] .......................................... H01L 21/8247
(52) U.S. Cl. ........................ 438/260; 438/264; 438/266
(58) Field of Search .................................. 438/257–267

(56) References Cited

U.S. PATENT DOCUMENTS

| | | | | |
|---|---|---|---|---|
| 5,937,295 A | * | 8/1999 | Chen et al. ................. | 438/257 |
| 5,943,571 A | * | 8/1999 | Schaefer et al. ............ | 117/102 |
| 5,989,958 A | * | 11/1999 | Forbes ........................ | 438/257 |
| 6,010,934 A | * | 1/2000 | Wu .............................. | 438/257 |
| 6,060,743 A | * | 5/2000 | Sugiyama et al. ............ | 257/12 |
| 6,165,842 A | * | 12/2000 | Shin et al. ................... | 438/257 |
| 6,300,193 B1 | * | 10/2001 | Forbes ........................ | 438/257 |
| 6,331,463 B1 | * | 12/2001 | Chen ........................... | 438/257 |

* cited by examiner

Primary Examiner—Richard Booth
(74) Attorney, Agent, or Firm—Sonnenschein, Nath & Rosenthal

(57) ABSTRACT

A memory device, a manufacturing method thereof, and an integrated circuit thereof are provided for storing information over a long period of time even if the memory device is manufactured at low temperatures. On a substrate made of glass, etc., a memory transistor and a selection transistor are formed, with a silicon nitride film and a silicon dioxide film in between. The memory transistor and the selection transistor are connected in series at a second impurity region. The conduction region for memory of the memory transistor is made of non-single crystal silicon and a storage region comprises a plurality of dispersed particulates made of non-single crystal silicon. Therefore, electrical charges can be stored partially if a tunnel insulating film has any defects. The tunnel insulating film is formed by exposing the surface of the conduction region for memory to the ionized gas containing oxygen atoms.

7 Claims, 15 Drawing Sheets

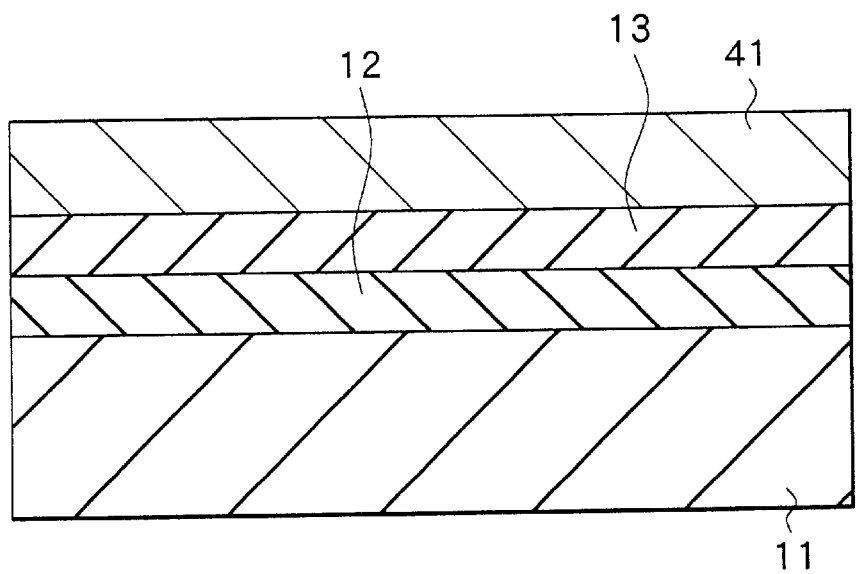
FIG.2A
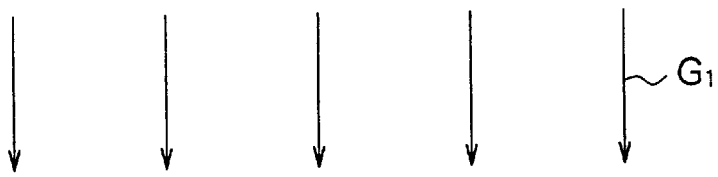
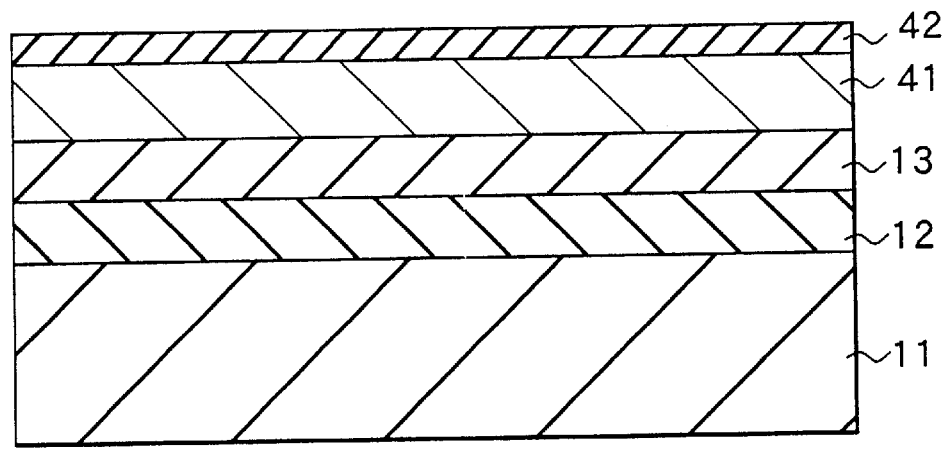
FIG.2B

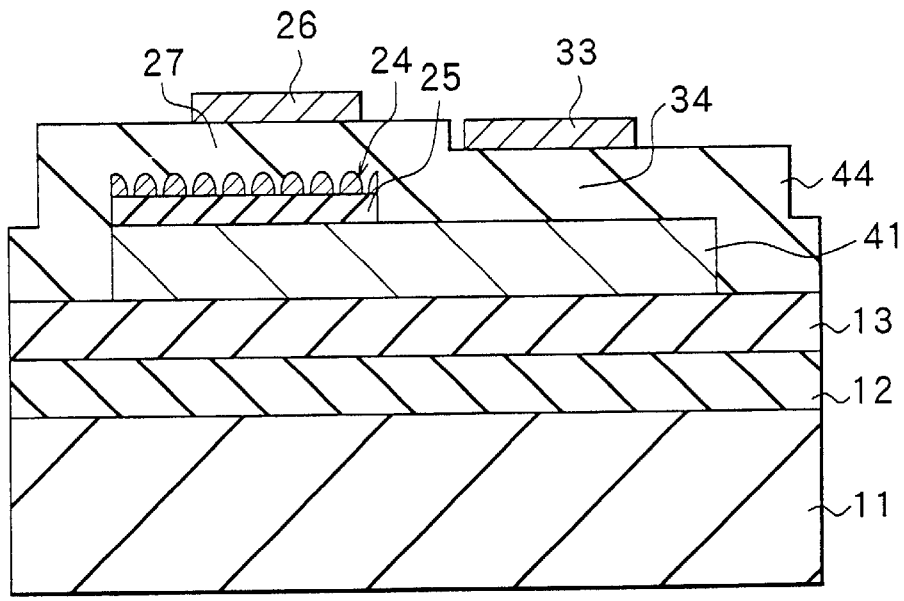
FIG.6A
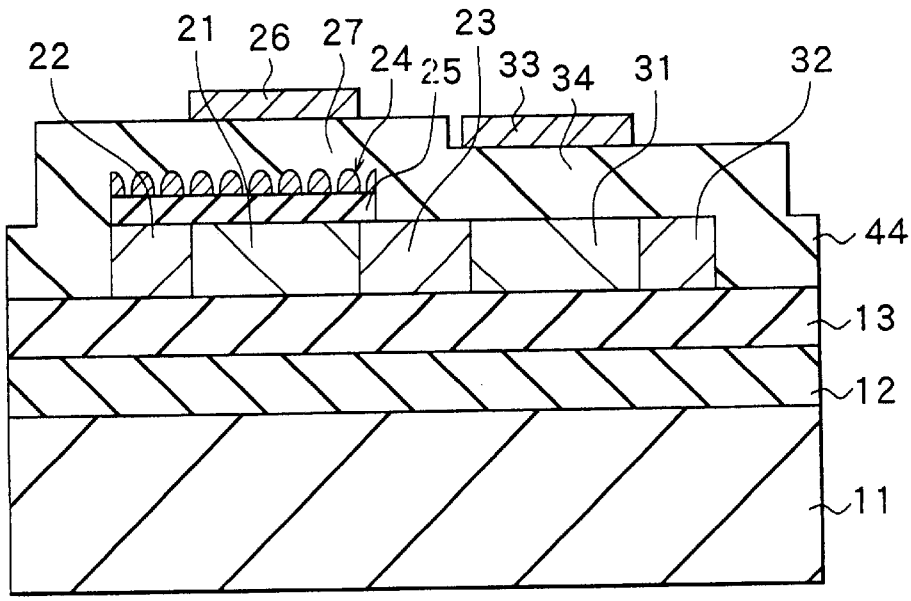
FIG.6B

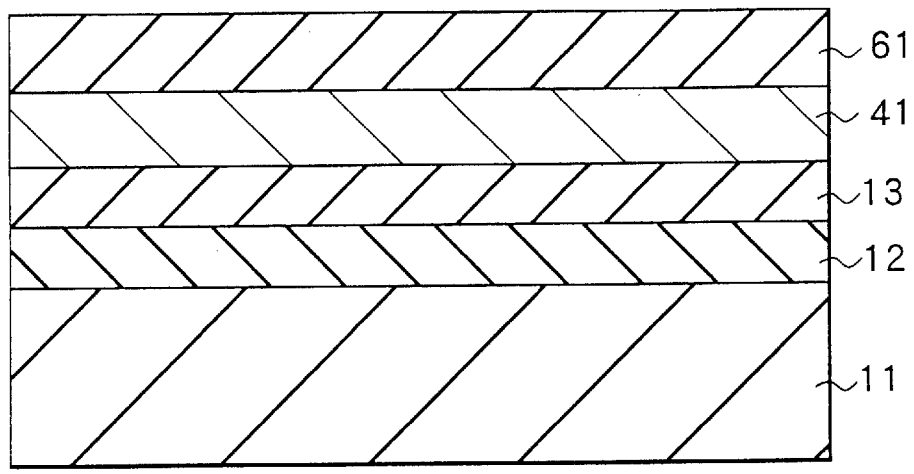
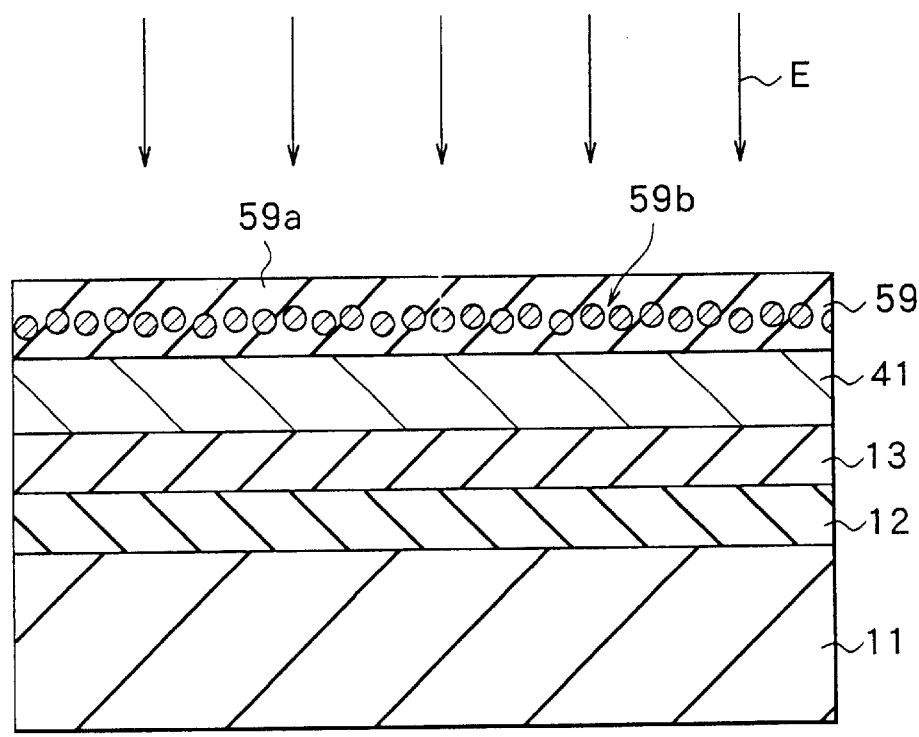

MEMORY DEVICE, MANUFACTURING METHOD THEREOF AND INTEGRATED CIRCUIT THEREOF

CROSS-REFERENCE TO RELATED APPLICATION

This application is a divisional application of Ser. No. 09/404,479, filed Sep. 24, 1999, now U.S. Pat. No. 6,274,903 incorporated herein in its entirety.

RELATED APPLICATION DATA

The present application claims priority to Japanese Application No. P10-274983 filed Sep. 29, 1998 which application is incorporated herein by reference to the extent permitted by law.

BACKGROUND OF THE INVENTION

1. Field of the Invention

The present invention relates to a memory device for storing information by accumulating electrical charges moved from a conduction region for memory in a storage region and a manufacturing method thereof, and an integrated circuit thereof for integrating such memory devices. More specifically, the present invention relates to a memory device having the conduction region for memory formed on an insulator and a manufacturing method thereof, and an integrated circuit thereof for integrating such memory devices.

2. Description of the Related Art

A typical memory device according to the related art, EEPROM (Electrically Erasable Programmable Read-Only Memory) or flash memory, for instance, is provided with a layer of storage region between a memory gate electrode and a conduction region. The storage region stores information by accumulating electrical charges (that is, electrons or holes) moved from the conduction region to this storage region by tunnel effects. The insulating film between the conduction region and the storage region has been formed hitherto by thermal-oxidation of the surface of the conduction region made of silicon (Si) at a high temperature in the range of 800–1000° C.

As described above, in the memory device according to the related art, the insulating film has been formed by heat treatment at a high temperature. As a result, the memory device is unable to be formed on a substrate made of insulator such as silicate glass, quartz glass or plastics, which have a low melting point.

On the other hand, if we try to form the insulating film by thermal oxidation at a low temperature of 500° C. or lower, high insulation performance cannot be achieved. In addition, electrical charges accumulated in the storage region leak to the conduction region in a short time through a large amount of defects in the insulating film, and thus the information is unable to be stored over a long period of time.

It is therefore an object of the present invention to provide a memory device which can store information over a long period of time even when it is manufactured at low temperatures and a manufacturing method thereof, and an integrated circuit for integrating such memory devices.

SUMMARY OF THE INVENTION

A memory device according to the present invention comprises: a base portion made of an insulator; a conduction region for memory made of a semiconductor provided on one surface of the base portion; a first impurity region provided adjacent to the conduction region for memory; a second impurity region separated from the first impurity region and provided adjacent to this conduction region for memory; a storage region comprising a plurality of dispersed particulates for accumulating electrical charges moved from the conduction region for memory; a tunnel insulating film provided between the storage region and the conduction region for memory; a control electrode for memory for controlling the electrical charge amount of the storage region and the conductivity of the conduction region for memory; an insulating film for controlling memory provided between the control electrode for memory and the storage region; a conduction region for selection provided on part of the base portion, which is adjacent to the second impurity region and separated from the conduction region for memory; a third impurity region provided adjacent to the conduction region for selection and separated from the second impurity region; a control electrode for selection for controlling the conductivity of the conduction region for selection; and an insulating film for controlling selection provided between the control electrode for selection and the conduction region for selection.

A method for manufacturing a memory device according to the present invention comprises the steps of: forming a conduction region for memory and a conduction region for selection made of semiconductors on a base portion made of an insulator; forming a tunnel insulating film on the conduction region for memory; forming a storage region comprising a plurality of particulates dispersed on the tunnel insulating film; forming an insulating film for controlling memory on the storage region while forming an insulating film for controlling selection on the conduction region for selection; forming a control electrode for memory on the insulating film for controlling memory while forming a control electrode for selection on the insulating film for controlling selection; and forming a first impurity region adjacent to the conduction region for memory, a second impurity region separated from the first impurity region and adjacent to the conduction region for memory and to the conduction region for selection, and a third impurity region separated from the second impurity region and adjacent to the conduction region for selection.

An integrated circuit according to the present invention has a plurality of memory devices integrated, and each of the memory devices comprises a base portion made of an insulator, a conduction region for memory made of a semiconductor provided on one surface of the base portion, a first impurity region provided adjacent to the conduction region for memory, a second impurity region separated from the first impurity region and provided adjacent to the conduction region for memory, a storage region comprising a plurality of dispersed particulates for accumulating electrical charges moved from the conduction region for memory, a tunnel insulating film provided between the storage region and the conduction region for memory, a control electrode for memory for controlling the electrical charge amount of the storage region and the conductivity of the conduction region for memory, an insulating film for controlling memory provided between the control electrode for memory and the storage region, a conduction region for selection provided on one surface of the base portion, which is adjacent to the second impurity region and separated from the conduction region for memory, a third impurity region provided adjacent to the conduction region for selection and separated from the second impurity region, a control electrode for selection for controlling the conductivity of the conduct ion region for selection; and an insulating film for controlling selection provided between the control electrode for selection and the conduction region for selection.

In the memory device according to the present invention, the conductivity of the conduction region for selection is controlled through applying voltage to the control electrode for selection, and accordingly, the conductivity of the conduction region for memory is controlled. In addition, electrical charges are moved from the conduction region for memory to the storage region to be accumulated in the storage region by applying voltage to the control electrode for memory, and the information is thereby written into the device. In the device, the storage region comprises plurality of dispersed particulates. Therefore, electrical charges accumulated in particulates formed at the non-defect region in the tunnel insulating film do not leak even if electrical charges accumulated in part of particulates leak through defects in the tunnel insulating film. Consequently, information can be stored over a long period of time.

In the method for manufacturing a memory device according to the present invention, first of all, a conduction region for memory and a conduction region for selection made of a semiconductor are formed on the base portion made of insulator. Then, on the conduction region for memory, a tunnel insulating film is formed, on which the storage region comprising the plurality of dispersed particulates is formed. Successively, on the storage region, an insulating film for controlling memory is formed, and the insulating film for controlling selection is formed on the conduction region for selection. Thereafter, on the insulating film for controlling memory, a control electrode for memory is formed, and on the insulating film for controlling selection, the control electrode for selection is formed. In addition, the first impurity region, the second impurity region, and the third impurity region are formed, respectively.

The integrated circuit according to the present invention has memory devices according to the present invention. Since the storage region is constructed with a plurality of dispersed particulates, the information can be stored over a long period of time.

Other and further objects, features and advantages of the invention will appear more fully from the following description.

BRIEF DESCRIPTION OF THE DRAWINGS

FIGS. 2A and 2B are cross-sectional views showing respective manufacturing steps of the memory device shown in FIG. 1;

FIGS. 6A and 6B are cross-sectional views showing respective manufacturing steps following those of FIGS. 5A and 5B;

FIGS. 14A and 14B are cross-sectional views showing respective manufacturing steps of the memory device shown in FIG. 13.

DETAILED DESCRIPTION OF THE PREFERRED EMBODIMENTS

Preferred embodiments of the present invention will now be described in detail with reference to the accompanied drawings.

(First Embodiment)

Figure 1:
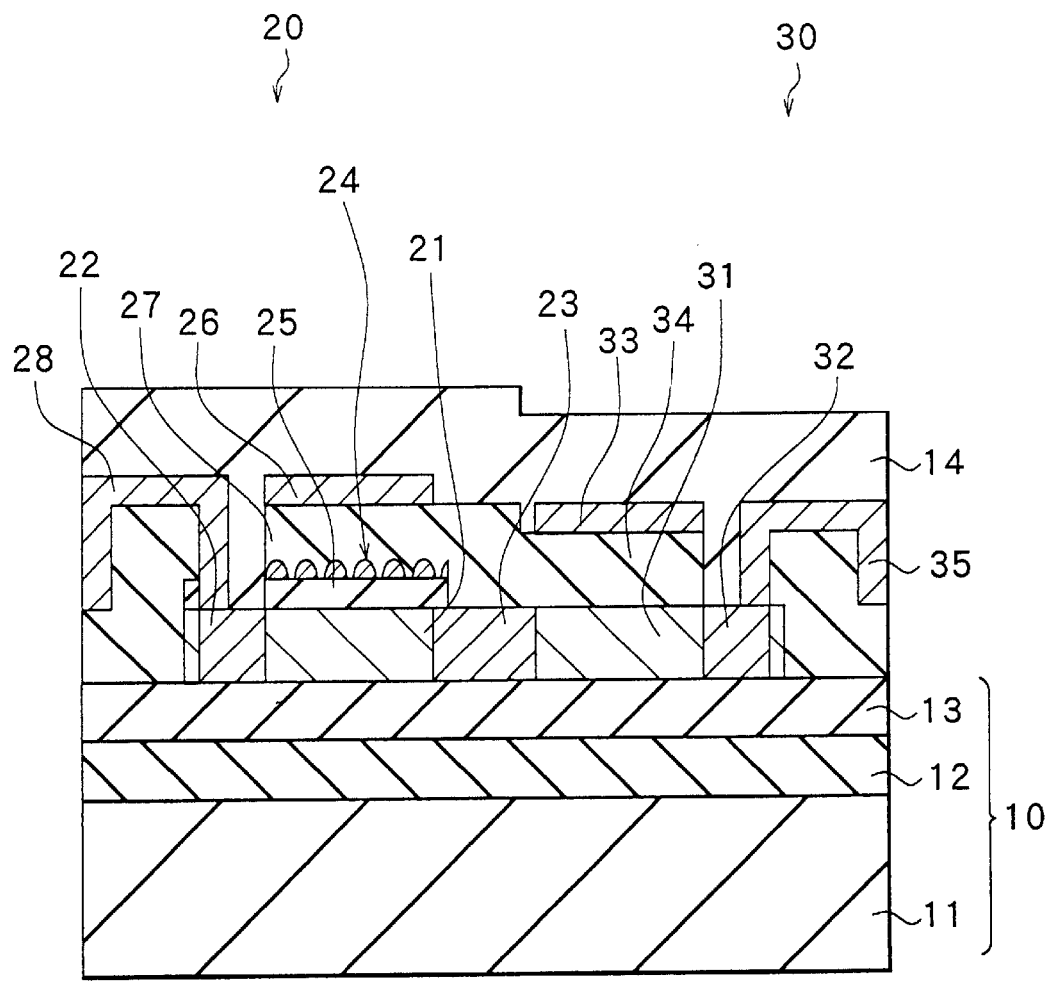
FIG. 1 is a cross-sectional view showing the configuration of a memory device related to a first embodiment according to the present invention.

FIG. 1 shows a configuration of a memory device relating to a first embodiment according to the present invention. The memory device is provided with a base portion 10 made of an insulator. The base portion 10 comprises a substrate 11 made of glass, silicon nitride ($Si_3N_4$) layer 12 on the substrate 11, and dioxide ($SiO_2$) layer 13 on the silicon nitride layer 12, for example. The substrate 11 is 0.4 mm in thickness. The silicon nitride layer 12 and the dioxide layer 13 have a thickness of about 100 nm each. The silicon nitride layer 12 and the silicon dioxide layer 13 function as buffer layers.

On the silicon dioxide layer 13, a memory transistor 20 and a selection transistor 30 are formed. On the memory transistor 20 and the selection transistor 30, a protection film 14 made of silicon nitride or silicon dioxide is formed. The memory transistor 20 is provided with a conduction region 21 for memory, an impurity region 22 adjacent to the conduction region 21 and an impurity region 23 adjacent to the conduction region 21, which are formed on the silicon dioxide layer 13.

The conduction region 21 has a thickness in the order of several tens nm, and serves as a path for current. The conduction region is made of polycrystal silicon, for example The impurity region 22 has a thickness in the order of several tens nm and functions as the source of the memory transistor 20. The impurity region 22 is made of polycrystal silicon with V-group elements such as phosphor (P), for example. The impurity region 23 has a thickness in the order of several tens nm and functions as the drain of the memory transistor 20. The impurity region 23 is made of polycrystal silicon with V-group elements such as phosphor (P), for example. The second impurity region also functions as the source of a selection transistor 30.

On the conduction region 21, a storage region 24 is formed for accumulating electrical charges (electrons in this case) moved from the conduction region 21 by the quantum effects. The storage region 24 comprises a plurality of dispersed particulates made of a semiconductor such as silicon or germanium (Ge). Between the storage region 24 and the conduction region 21, a tunnel insulating film 25 is formed. The tunnel insulating film 25 is made of an oxide, for example, and is thin enough for electrical charges to tunnel through (less than 50 nm, for example).

The storage region 24 comprises a plurality of dispersed particulates. This is for accumulating electrical charges while dividing them into a plurality of parts of particulates, thereby preventing electrical charges accumulated in other parts from leaking from the storage region 24, even if electrical charges accumulated partly leak through defects of tunnel insulating film 25.

On the storage region 24, a control electrode 26 for memory is formed for controlling the conductivity of the conduction region 21 and the amount of the electrical charge of the storage region 24. The control electrode 26 is made of non-single crystal silicon (polycrystal or amorphous silicon) whose resistance has been lowered by adding impurities. The impurities added to the non-single crystal silicon may be V-group elements such as phosphor, an n-type impurity, or III-group elements such as boron (B), a p-type impurity. The control electrode 26 may be made of aluminum (Al), copper (Cu), or other low-resistance metals.

Between the control electrode 26 and the storage region 24, an insulating film 27 for controlling memory is formed. The insulating film 27 is formed from an insulator such as silicon dioxide, silicon nitride, compound of nitrogen, oxygen, and silicon (silicon oxide nitride), and is thick enough for electrical charges not to tunnel through easily (50 nm or more, for example). The control electrode 26 and the insulating film 27 are in non-ohmic contact condition.

A source electrode 28 is connected to the impurity region 22. The source electrode 28 is made of aluminum, copper, or other low-resistant metals, and is in ohmic contact with the impurity region 22.

The selection transistor 30 comprises a conduction region 31 for selection formed on the silicon dioxide layer 13 and adjacent to the impurity region 23 and a impurity region 32 formed on the silicon dioxide layer 13 and adjacent to the conduction region 31. That is, the conduction region 31 is connected to the conduction region 21 in series. The conduction region 31 has a thickness in the order of several tens nm, and serves as a path for current. The conduction region is formed from polycrystal silicon, for example. The impurity region 31 has a thickness in the order of several tens nm and functions as the drain of the selection transistor 30. The impurity region is made of polycrystal silicon with V-group elements such as phosphor.

On the conduction region 31, a control electrode 33 for selection is formed in order to control the conductivity of the conduction region 31. The control electrode 33 is made of non-single crystal silicon whose resistance has been lowered by adding impurities. The impurities added to the non-single crystal silicon may be V-group elements such as phosphor, n-type impurities or III-group elements such as boron, p-type impurities. The control electrode 33 may be made of aluminum, copper, or other low-resistance metals.

Between the control electrode 33 and the conduction region 31, an insulating film 34 is formed. The insulating film 34 is formed from an insulator such as silicon dioxide, silicon nitride (silicon oxide nitride), and is thick enough for electrical charges not to tunnel through easily (50 nm or more, for example). The control electrode 33 and the insulating film 34 are in the non-ohmic contact with each other.

A drain electrode 35 is connected to the impurity region 32. The drain electrode 35 is made of aluminum, copper, or other low-resistant metals, and is in ohmic contact with the impurity region 32.

Next, an operation of the memory device will now be described in the followings.

In this memory device, an example of writing information is as follows. A voltage of 20V is applied to the control electrode 33 and to the impurity region 32, while a voltage of 10V is applied to the control electrode 26, with the impurity region 22 set at 0V. Thereby the electrical charges (electrons in this case) are moved from the conduction region 21 to the storage region 24 by the tunnel effect, and thus information is written.

Information written as described above is maintained by bringing the impurity region 22, the control electrode 26, the impurity region 32, and the control electrode 33 to the same potential or floating potential. In addition, in this memory device, the storage region 24 is composed of a plurality of parts of dispersed particulates. As a result, electrical charges accumulated in the particulates formed in the non-defect region of the tunnel insulating film 25 do not leak even when electrical charges accumulated partly leak through defects in the tunnel insulating film 25. Therefore, information can be stored over a long period of time.

An example of reading out information is as follows. The conductivity or current value of the conduction region 21 with respect to the potential of the control electrode 26 is measured with 5V, which is the positive potential, applied to the control electrode 33. Thereby the electrical charge amount accumulated in the storage region 24 is detected, and thus information is read out.

An example of erasing information is as follows. A voltage of −20V is applied to the control electrode 33 and to the impurity region 32, while a voltage of −10V is applied to the control electrode 26, with the impurity region 22 set at 0V. Thereby the electrical charges (electrons in this case) accumulated in the storage region 24 are moved to the conduction region 21 by the tunnel effect, and thus information is erased.

A method of manufacturing this memory device will now be described in the followings.

FIGS. 2A and 2B through 7 show the steps of the manufacturing method. First of all, as shown in FIG. 2A, a substrate 11 made of quartz glass, for example, is prepared, and a silicon nitride layer 12 and a silicon dioxide layer 13 are successively stacked on the substrate 11 by CVD (Chemical Vapor Deposition) or sputtering. Then, on the silicon dioxide layer 13, a semiconductor layer 41 is deposited by CVD or sputtering. The semiconductor layer 41 is made of polycrystal silicon. The conduction regions 21 and 31 will be formed in the semiconductor layer 41 in later steps.

Then, as shown in FIG. 2B, the surface of the semiconductor layer 41 is exposed in the atmosphere of ionized gas $G_1$ containing oxygen atoms (O), for example. In such event, the temperature of substrate 11 is set to 150° C., for example. The ionized gas $G_1$ is generated by transporting oxygen gas of 0.6 Torr to an electromagnetic field at 13.6 MHz and 350W AC, for example. Accordingly, on the surface of the semiconductor layer 41, an oxide film 42 is formed as the tunnel insulating film 25. The oxide film 42 and the interface between the oxide film 42 and the semiconductor layer 41 have a large number of defects.

Figure 3A:
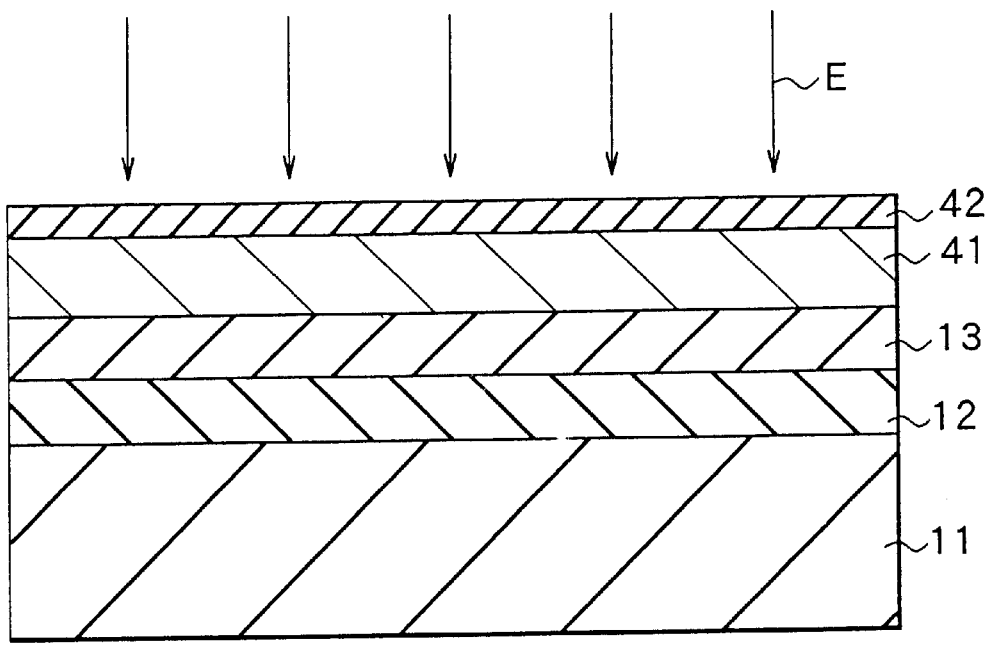
FIGS. 3A and 3B are cross-sectional views showing respective manufacturing steps following those of FIGS. 2A and 2B.
Figure 3B:
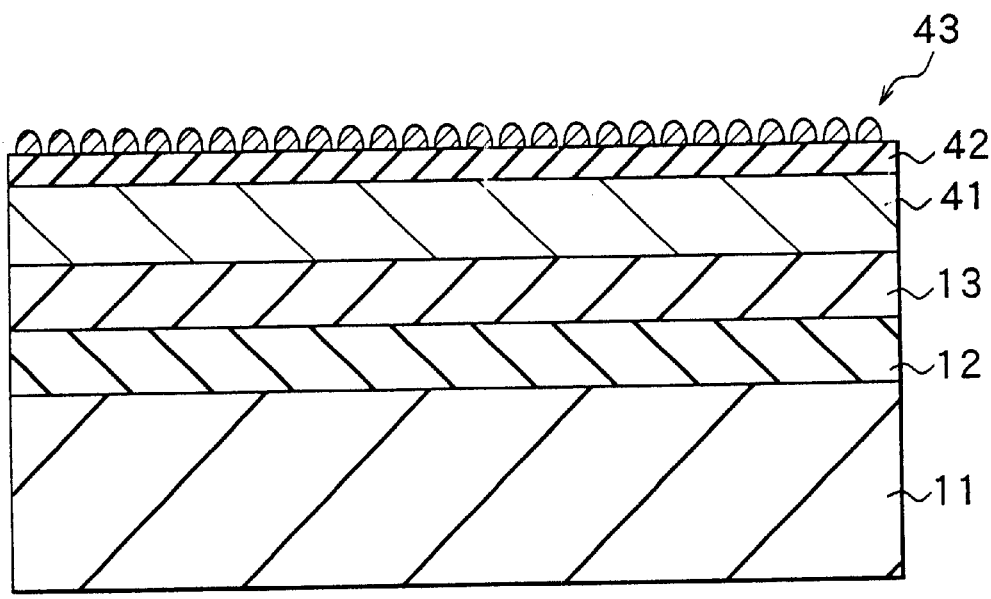

After forming the oxide film 42, as shown in FIG. 3A, the surface of the oxide film 42 is irradiated with energy beam E absorbed by the semiconductor layer 41 to heat the surface of the semiconductor layer 41 and the oxide film 42.

Examples of the energy beam E are eximer laser beam and electron beam. For the wavelength of the eximer laser beam, 308 nm of XeCl, 248 nm of KrF, or 193 nm of ArF, etc., is used.

The irradiation time of energy beam E should be as short as 100 nsec or so, and the temperature of the surface of the semiconductor layer 41 should be higher than the temperature when the oxide film 42 is formed. Consequently, by this heating, only the temperature of the surface of the semiconductor layer 41 and the oxide film 42 instantaneously rises, but the temperature of the base portion 10 does not rise. Accordingly, defects at the oxide film 42 and at the interface between the oxide film 42 and the semiconductor layer 41 decrease. As a result, the quality of the oxide film 42 is improved.

After irradiating the surface with the energy beam E, by a vapor growth such as CVD or sputtering, a semiconductor fine particle layer 43 is formed. The semiconductor fine particle layer 43 constitutes the storage region 24 and is made of a semiconductor such as silicon or germanium. The semiconductor fine particle layer 43 is formed so as to cover the surface of oxide film 42 at a coverage factor smaller than 1. In other words, a plurality of particulates begin to grow dispersedly on the oxide film 42, and stop growing before particulates grow to cover the whole surface of the oxide film 42.

Figure 4A:
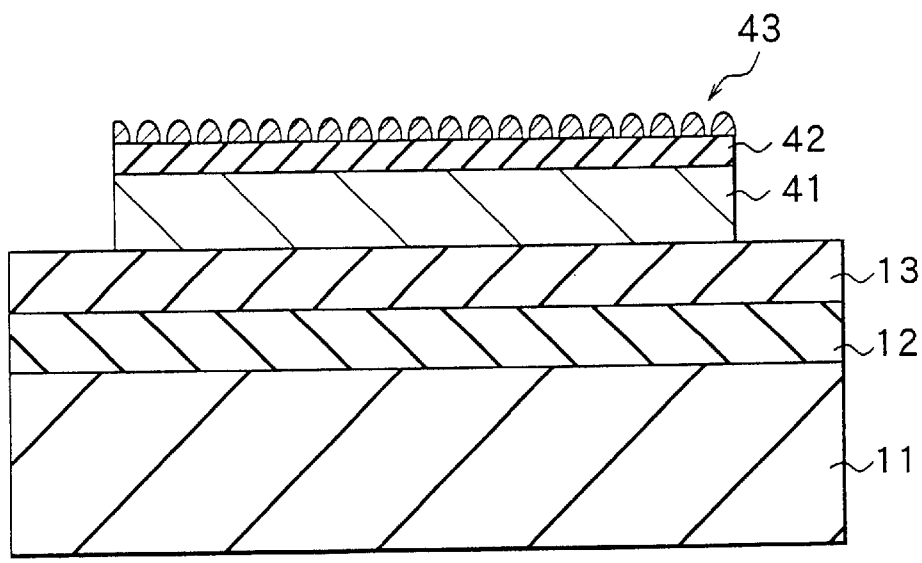
FIGS. 4A and 4B are cross-sectional views showing respective manufacturing steps following those of FIGS. 3A and 3B.

Then, as shown in FIG. 4A, the semiconductor fine particle layer 43, the oxide film 42 and the semiconductor layer 41 are partly removed by etching using ionized gas such as sulfur hexafluoride ($SF_6$) or carbon tetrafluoride ($CF_4$). The parts not removed will be formed into the conduction region 21, the impurity region 22, the impurity region 23, the conduction region 31 and the impurity region 32 in later steps. By this operation, the device is separated.

Figure 4B:
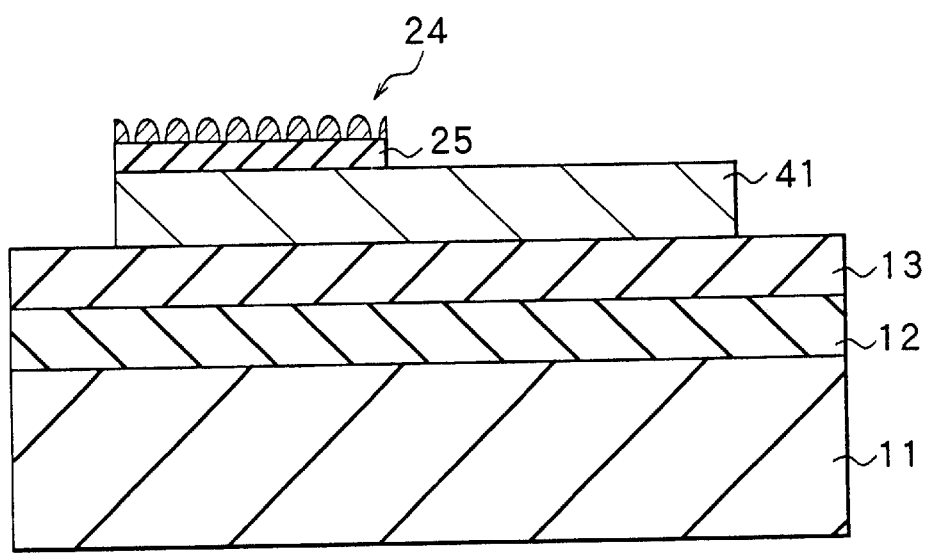

Next, as shown in FIG. 4B, the semiconductor fine particle layer 43 and the oxide film 42 are partly removed by etching using mixture gas such as carbon tetrafluoride and hydrogen ($H_2$). The parts not removed will be formed into the conduction region 21 in later steps. With this operation, the storage region 24 and the tunnel insulating film 25 are formed.

Figure 5A:
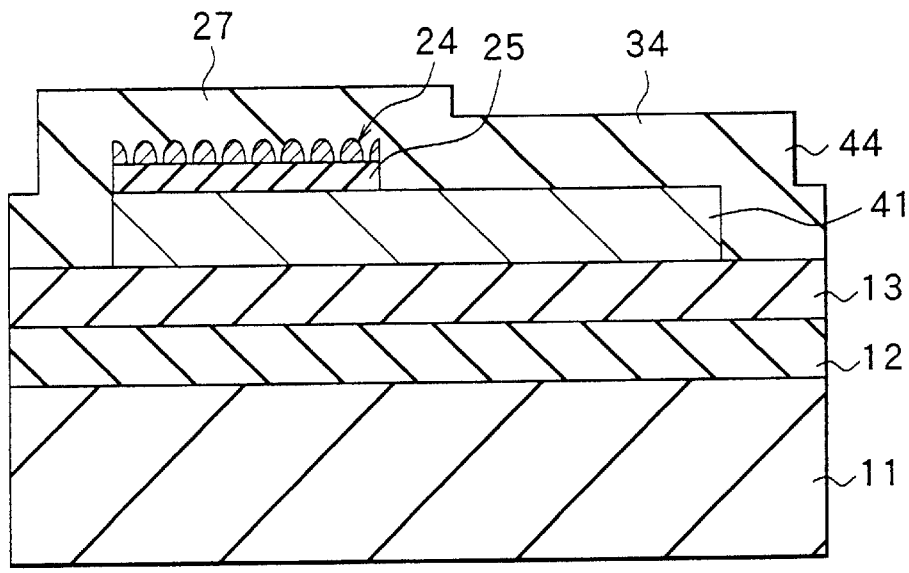
FIGS. 5A and 5B are cross-sectional views showing respective manufacturing steps following those of FIGS. 4A and 4B.
Figure 5B:
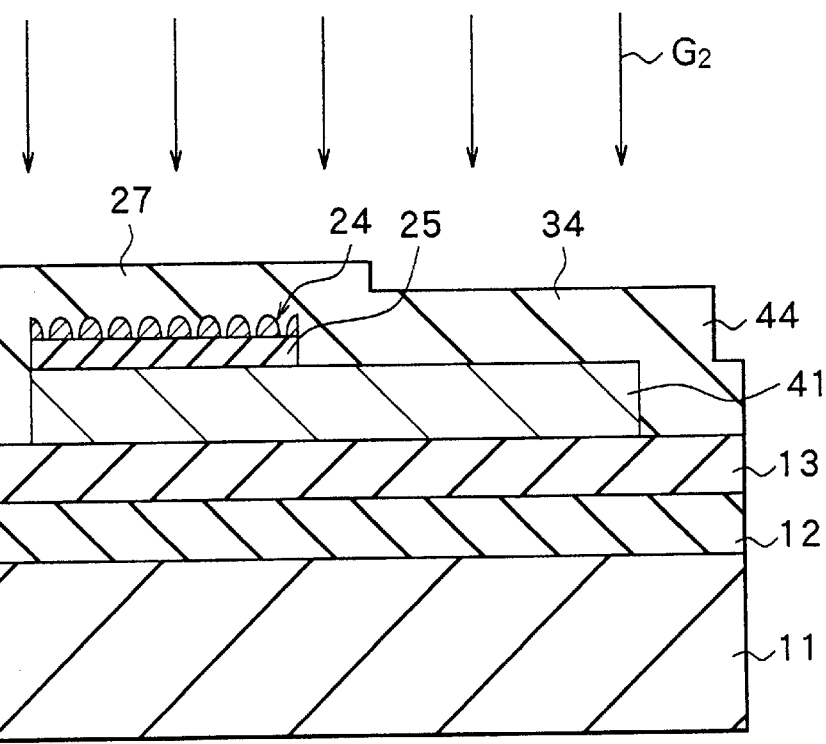

After that, as shown in FIG. 5A, by CVD or sputtering, the insulating film 44 made of silicon dioxide, silicon nitride, or silicon oxide nitride is formed on the whole surface. Thus, the insulating film 27 and the insulating film 34 are formed. Then, as shown in FIG. 5B, the surface is exposed in the atmosphere of ionized gas $G_2$ containing hydrogen atoms (H), for example. Thereby, defects at the interface between the insulating film 27 and the conduction region 21 as well as defects at the interface between the insulating film 34 and the conduction region 31 can be reduced.

Thereafter, as shown in FIG. 6A, on the insulating film 27 and insulating film 34, the control electrode 26 and the control electrode 33 are formed from non-single crystal silicon, by using CVD or sputtering. The control electrode 26 and the control electrode 33 may be formed from metal by vacuum evaporation method, for example.

Next, as shown in FIG. 6B, the impurity regions 22, 23 and 32 are formed by injecting V-group elements such as phosphor into the semiconductor layer 41 by ion implantation, for example, with the control electrode 26 and the control electrode 33 used as a mask. Thus, impurities are added to the semiconductor layer 41 to form the impurity regions 22, 23 and 32 while the conduction regions 21 and 31 are formed in between.

Thereafter, though not illustrated, energy beam absorbed by the impurity regions 22, 23 and 32 is applied to activate the impurities added. An example of the energy beam is eximer laser beam.

Figure 7:
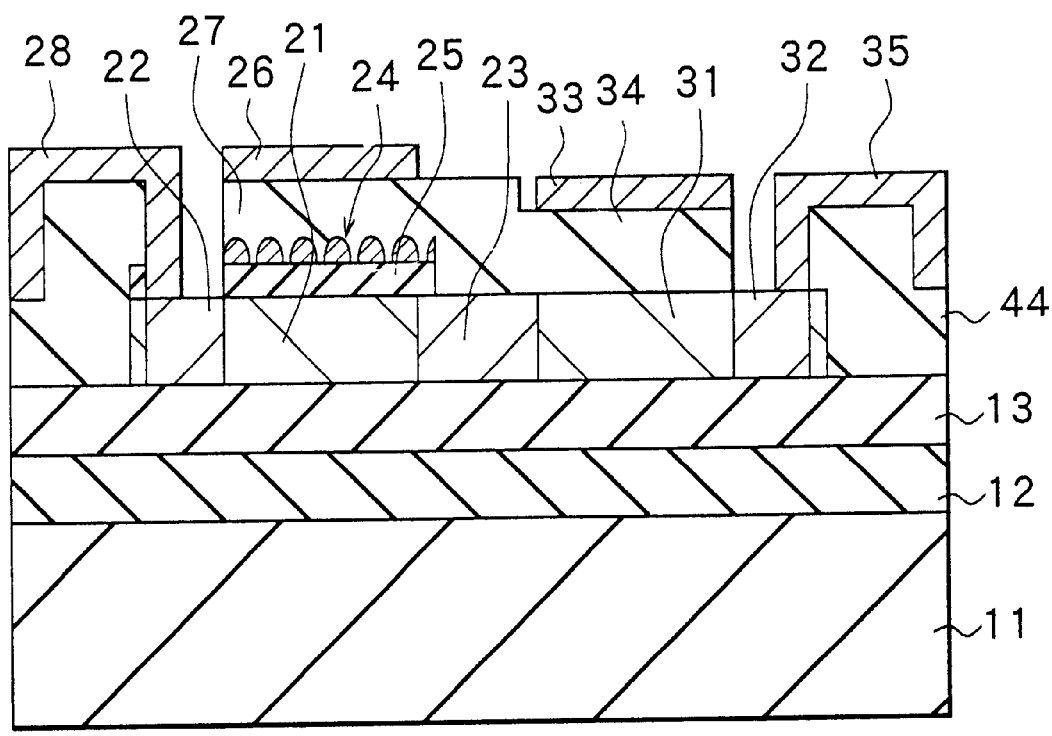
FIG. 7 is a cross-sectional view showing respective manufacturing step following those of FIGS. 6A and 6B.

Then, as shown in FIG. 7, the insulating film 44 is selectively removed so as to expose the surfaces of the impurity regions 22 and 32. Thereafter, by the vacuum evaporation, for example, the source electrode 28 is selectively formed on the impurity region 22, while the drain electrode 35 is selectively formed on the impurity region 32. At last the protection film 14 is formed on the whole surface by using CVD or sputtering, for example. Thereby, the memory device shown in FIG. 1 is formed.

Figure 8:
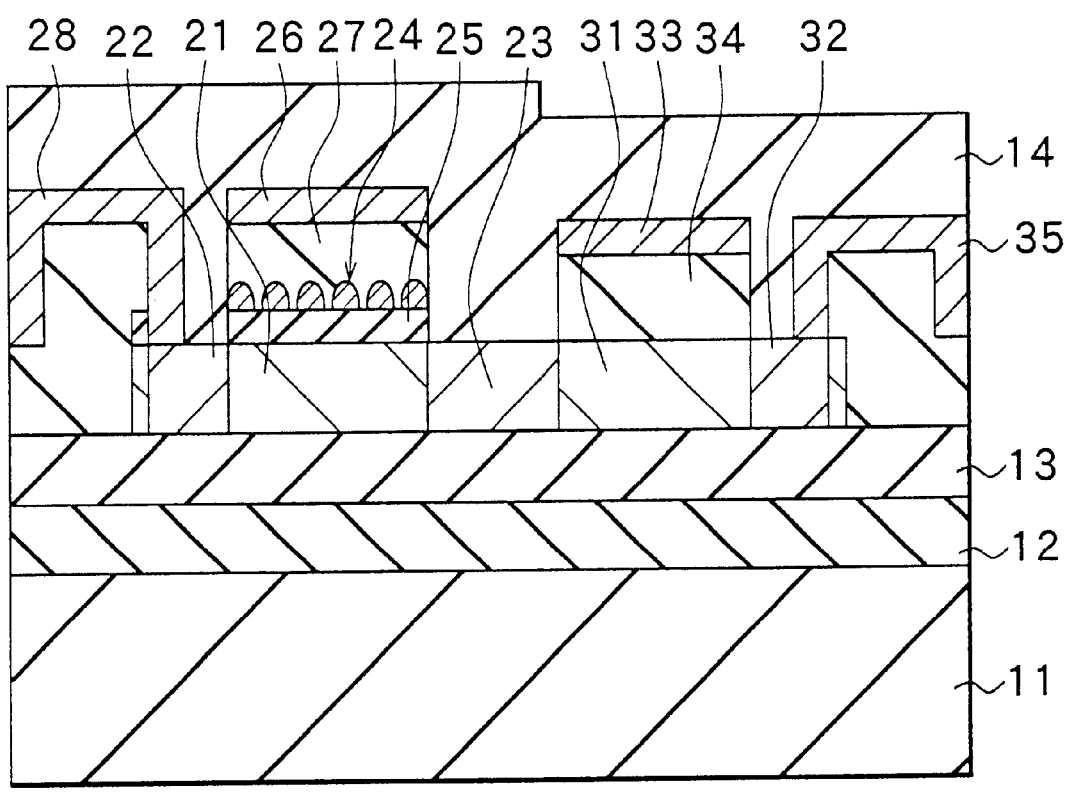
FIG. 8 is a cross-sectional view showing a modified example of the memory device shown in FIG. 1.

This memory device may be formed in the following manner after selectively forming the control electrode 26 and the control electrode 33 (see FIG. 6A). In this case, as shown in FIG. 8, the surface of the impurity region 23 is covered not with the insulating film 44 but with the protection film 14.

Figure 9A:
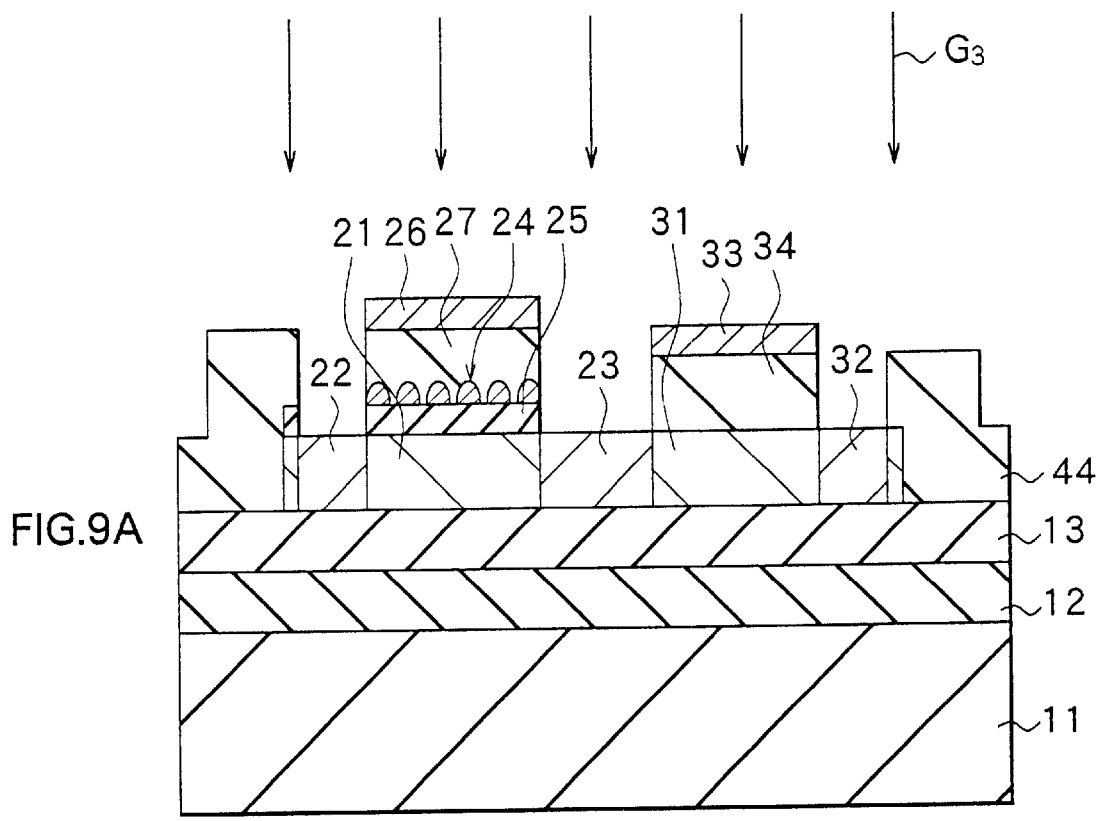
FIGS. 9A and 9B are cross-sectional views showing respective manufacturing steps of the memory element shown in FIG. 8.
Figure 9B:
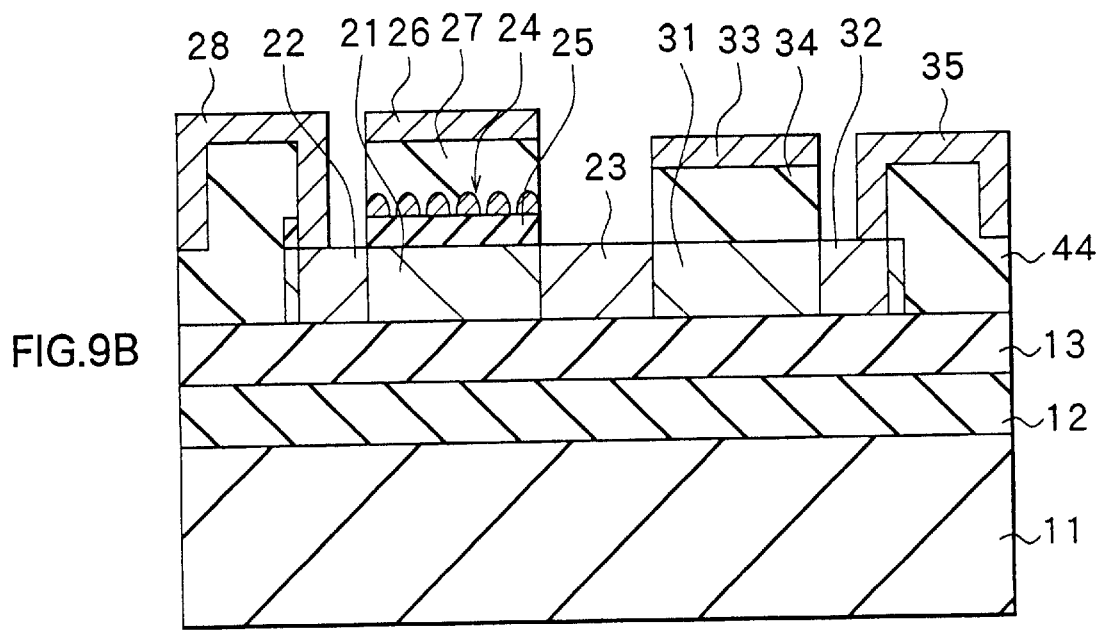

FIGS. 9A and 9B show the steps of the manufacturing method. As shown in FIG. 9A, the control electrode 26 and the control electrode 33 are formed, and then the insulating film 44 is partly removed. The parts not removed will be formed into the impurity regions 22, 23 and 32 in later steps. Thereafter, the surface is exposed in the atmosphere of ionized gas $G_3$ containing V-group elements such as phosphor, ionized gas of phosphine ($PH_3$), for example, thereby introducing impurities into the exposed region of the semiconductor layer 41. The impurity regions 22, 23 and 32 are thus formed through adding impurities to the semiconductor layer 41, while the conduction regions 21 and 31 are formed in between.

Then, though not illustrated, to activate the impurities added, the energy beam is applied to the impurity regions 22, 23 and 32.

After that, as shown in FIG. 9B, the source electrode 28 is formed on the impurity region 22 while the drain electrode is formed on the impurity region 32 by the vacuum evaporation, for example. At last, to cover this memory device, the protection film 14 is formed by CVD or sputtering. Thus the memory device shown in FIG. 8 is formed.

The memory device is integrated, for example, in the following manner and is put into use.

Figure 10:
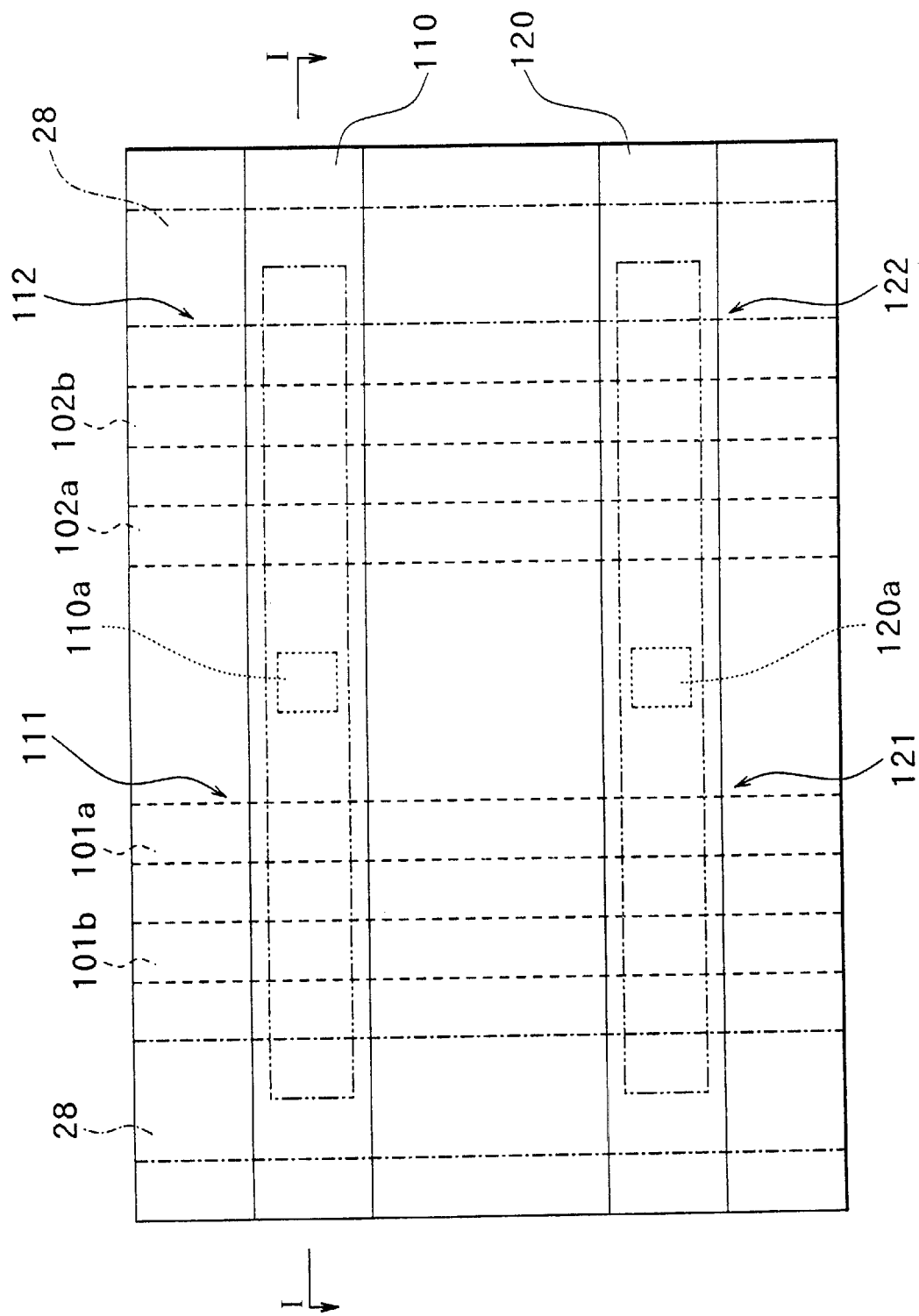
FIG. 10 is a plan view showing a configuration of an integrated circuit formed by integrating the memory elements shown in FIG. 1.
Figure 11:
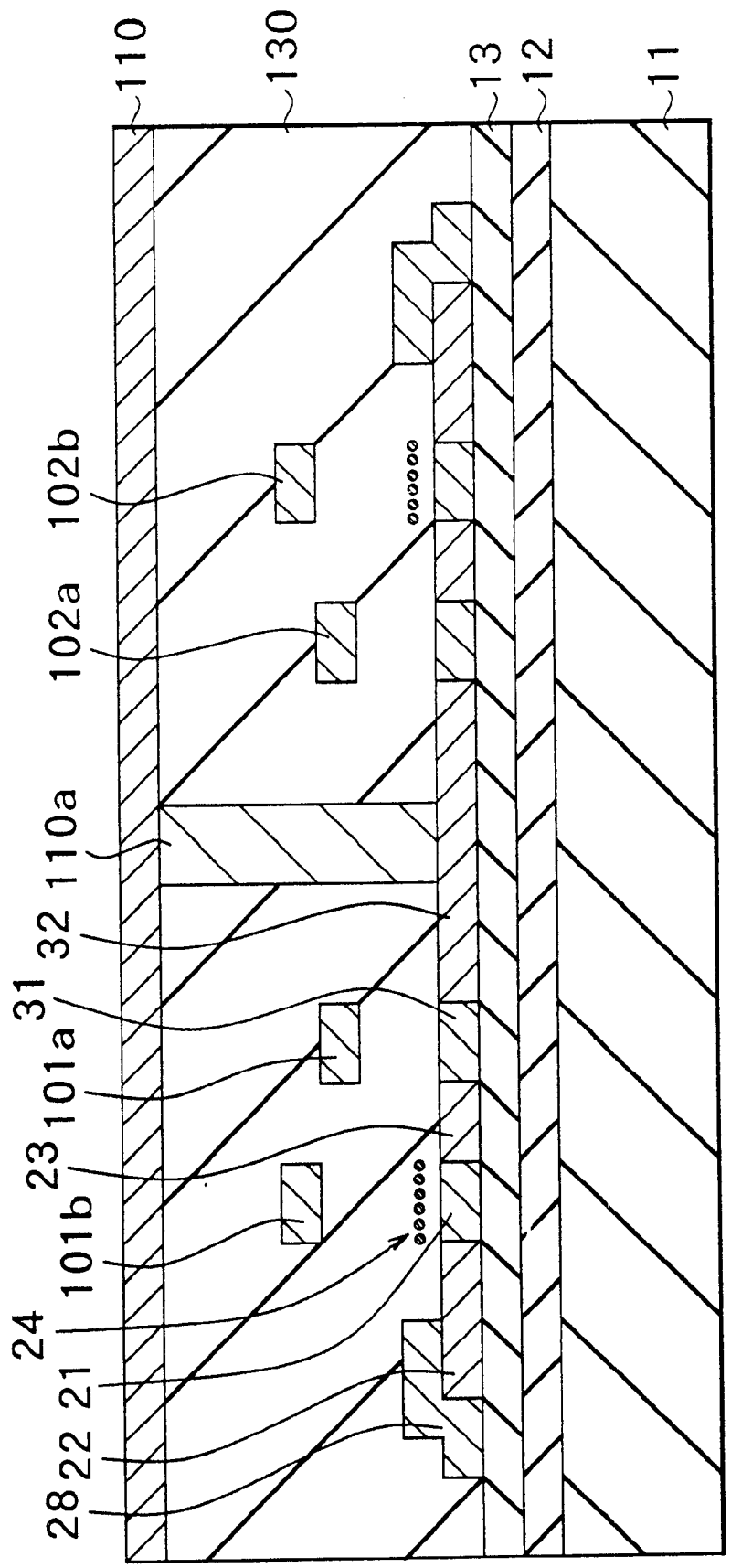
FIG. 11 is a cross-sectional view taken on line I—I of the integrated circuit of FIG. 10.
Figure 12:
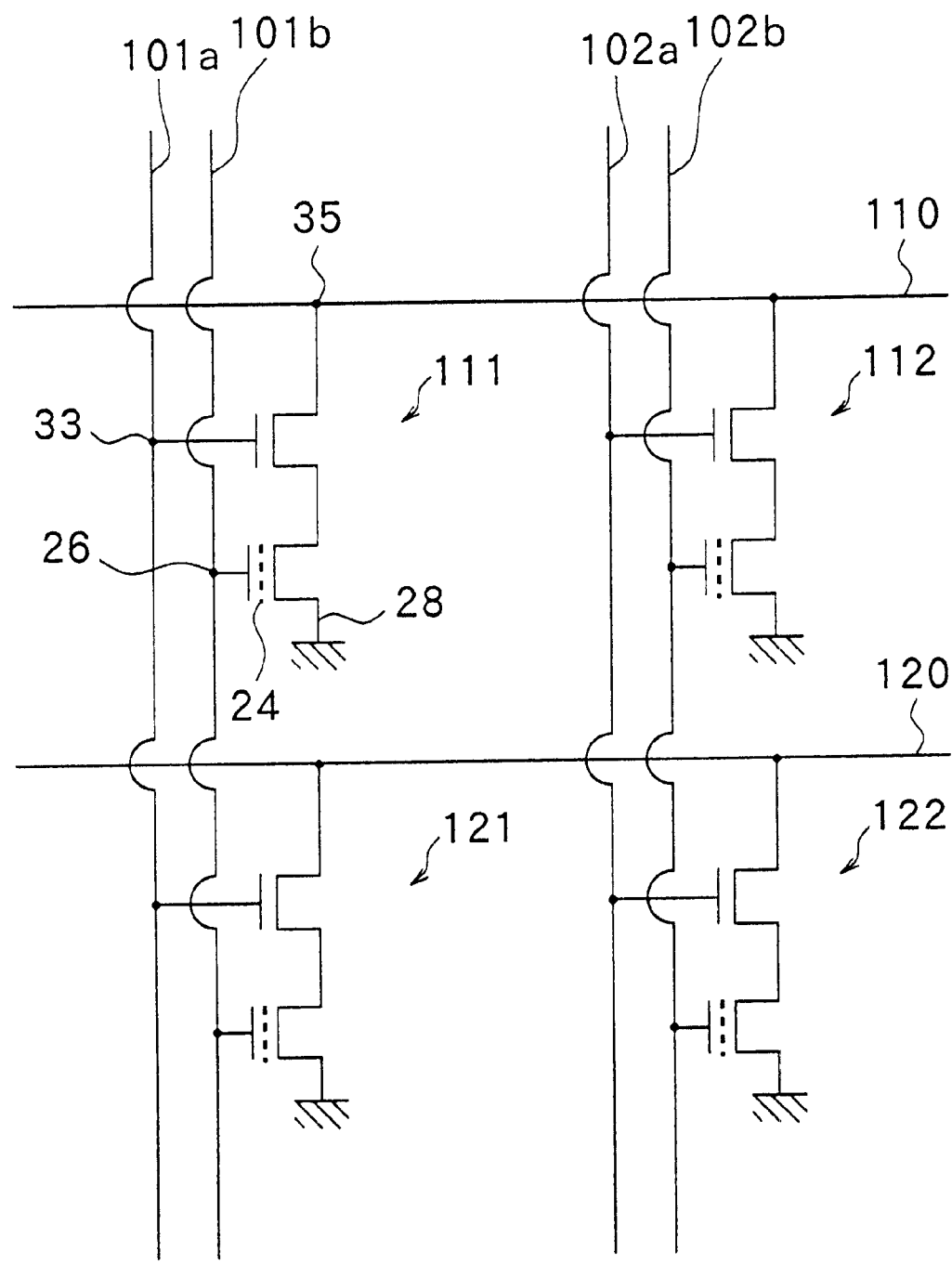
FIG. 12 is a circuit diagram showing the circuit configuration of the integrated circuit shown in FIG. 10.

FIG. 10 shows a plan view of an integrated circuit for integrating the memory devices. FIG. 11 shows the cross-sectional view taken along the line I—I of FIG. 10. FIG. 12 shows a schematic diagram of the integrated circuit shown in FIG. 10. This integrated circuit contains an array with memory devices 111, 112, 121 and 122 related to the present embodiment. Memory devices 111, 112, 121, 122 are connected to word lines 101a, 101b, 102a, 102b for each string, respectively, for example. Word lines 101a, 102a serve as control electrodes 33 of memory devices 111, 112, 121, 122, while word lines 101b, 102b serve as control electrodes 28 of memory devices 111, 112, 131, and 122.

Memory devices 111, 112, 121, 122 are also connected to bit lines 110, 120 for each row. Bit lines 110, 120 are formed on the word lines 101a, 101b, 102a, 102b, with the interlayer insulating film 130 in between, and connected to the impurity regions 32 of memory devices 111, 112, 121, 122, by the connection layers 110a, 120a, respectively. In other words, bit lines 110, 120 serve as the drain electrodes 35 of memory devices 111, 112, 121, 122.

In the integrated circuit, the memory devices 111 and 112 adjoin each other in the direction of the extension of the bit lines 110, while the memory devices 121 and 122 adjoin each other in the direction of the extension of the bit lines 120. However, the alignment of word lines 101a and 101b of memory devices 111 and 121 is opposite to that of word lines 102a and 102b of memory devices 112 and 122. That is, the impurity regions 32 are configured to adjoin each other. Each source electrode 28 of memory devices 111, 112, 121, 122 is grounded.

Next, the operation of the integrated circuit will be explained in the followings.

In this integrated circuit, an example of writing information to the memory device 111 is as follows. A high voltage of about 20V is applied to the word line 101a and to the bit line 110. Meanwhile, the word line 101b is set at 0V or a high voltage of about 10V is applied to the word line 101b, while the word lines 102a, 102b and bit line 120 are set at 0V. With this operation, only the selection transistor 30 of the memory device 111 is selected, and information is written to the memory transistor of the memory device 111.

In order to store the written information, all the word lines 101a, 101b, 102a, 102b and both of the bit lines 110, 120 are set at 0V or to the floating condition. In addition, to read out the information written to the memory device 111, current through the bit line 110 is to be measured, with a high voltage of about 5V applied to the word line 101a.

In order to erase the information stored in the memory device 111, a minus voltage of about −20V is applied to the word line 101a and to the bit line 110. Meanwhile, the word line 101b is set at 0V or a minus voltage of about −10V is applied to the word line 101b, while the word lines 102a, 102b and the bit line 120 are set at 0V. With this operation, only the selection transistor 30 of the memory device 111 is selected, and thus information stored in the memory transistor of memory device 111 is erased.

According to the memory device related to the present embodiment, the storage region 24 comprises a plurality of dispersed particulates. Therefore, it is possible to prevent electrical charges accumulated in particulates of the storage region 24 in the non-defect region from leaking even if the tunnel insulating film 25 is formed at low temperatures. In other words, information is able to be stored over a long period of time. As a result, it is possible to form the base portion 10 by using the substrate 11 made of inexpensive materials with a low melting point such as glass, and the conduction region 21 to be made of polycrystal silicon.

Moreover, the memory transistor 20 and the selection transistor 30 are combined so that memory devices with which information can be selectively written, erased, and read out can be easily formed and integrated.

Also, according to the method for manufacturing a memory device related to the present embodiment, a plurality of particulates dispersed by vapor phase epitaxy or sputtering covers the surface of the tunnel insulating film 25 at a coverage factor smaller than 1 and thus forms the storage region 24. Therefore, it is possible to easily manufacture memory devices related to the present embodiment.

In addition, according to the method for manufacturing a memory device related to the present embodiment, the tunnel insulating film 25 is formed through exposing the surface of the conduction region 21 to the ionized gas containing oxygen atoms. Therefore, the tunnel insulating film 25 can be formed at low temperatures. As a result, it is possible to form the base portion 10 by using the substrate 11 made of inexpensive materials with a low melting point such as glass. Furthermore, the energy beam is applied after the tunnel insulating film 25 is formed. This reduces defects in the tunnel insulating film 25 and at the interface between the tunnel insulating film 25 and the conduction region 21 without raising the temperature of the base portion 10. Consequently, information is able to be stored over a long period of time with stability even when memory devices are manufactured at low temperatures.

(Second Embodiment)

The memory device related to a second embodiment according to the present invention has the same configuration and operation as those of the first embodiment, except that p-type impurities are added to the impurity regions 22, 23 and 32 instead of n-type impurities. Also, the memory device is manufactured in the same manner as in the case of the first embodiment. Consequently, like component devices are given like reference numerals, and the detailed descriptions thereof are omitted. Corresponding component devices are also given like reference numerals, and are explained referring to FIG. 1 through FIG. 9B.

This memory device has a impurity regions 22, 23 and 32 made of polycrystal silicon with III-group elements such as boron, added as p-type impurities. In other words, to the storage region 24, holes are accumulated as electrical charges.

In this memory device, information is written, read or erased by applying a voltage with a sign opposite to that of the first embodiment. In FIG. 1, a voltage of −20V, lower than that of the impurity region 22, is applied to the control electrode 33 and the impurity region 32, with the impurity region 22 set at 0V. At the same time, the same potential as that of the impurity region 22 or a voltage of −10V, lower than that of the impurity region 22, is applied to the control electrode 26. Thereby electrical charges (holes in this case) are moved from the conduction region 21 to the storage region 24 by the tunnel effect and thus information is written.

The written information is stored by bringing the potential of the impurity regions 22 and 32, and the control electrodes 26 and 33 to the same potential or to the floating condition as in the case of the first embodiment.

The written information is read out by measuring the conductivity or current value of the conduction region 21 against the potential of the control electrode 26, with a voltage of −5V, which is the negative potential, applied to the control electrode 33.

Furthermore, the written information is erased by applying a voltage of 20V, higher than that of the impurity region 22, to the control electrode 33 and the impurity region 32, with the impurity region 22 set at 0V. At the same time, the same voltage as that of the impurity region 22 or a voltage of 10V, higher than that of the impurity region 22, is applied to the control electrode 26. Thereby electrical charges accumulated in the storage region 24 are moved to the conduction region 21 and thus information is erased.

In manufacturing this memory device, after forming the control electrode 26 and the control electrode 33, as shown in FIG. 6B, the III-group elements such as boron are selectively injected into the semiconductor layer 41 by ion implantation and thus the impurity regions 22, 23 and 32 are formed. Otherwise, the impurity regions 22, 23 and 32 may be formed as follows. In FIG. 9A, after forming the control electrodes 26 and 33, the area in which the impurity regions 22, 23 and 32 will be formed is exposed to the atmosphere of ionized gas containing the III-group atoms such as boron atoms, ionized gas of diborane ($B_2H_6$), for example.

The memory devices as described above are integrated as in the case of the first embodiment and provide the same effects as those of the first embodiment.

(Third Embodiment)

The memory device related to a third embodiment according to the present invention has the same configuration as that of the first embodiment except for the semiconductor from which the conduction regions 21 and 31, and the impurity regions 22, 23 and 32 are formed. And the memory device is manufactured in the same manner as in the case of the first embodiment. Consequently, like component devices are given like reference numerals, and the detailed descriptions thereof are omitted. Corresponding component devices are also given like reference numerals, and are explained referring to FIG. 1 through FIG. 9B.

In FIG. 1, this memory device has the conduction regions 21 and 31 made of amorphous silicon with no impurities added, and the impurity regions 22, 23 and 32 made of amorphous silicon or polycrystal silicon with n-type impurities added.

In manufacturing this memory device, as shown in FIG. 2A, on the silicon dioxide layer 13, the semiconductor layer 41 which will be formed into the conduction regions 21 and 31 in later steps is formed from amorphous silicon by CVD or sputtering, for example.

In FIG. 6B, when energy beam is applied after forming the impurity layers 22, 23 and 32 by ion injection, the amorphous silicon from which at least part of the impurity layers 22, 23 and 32 are formed may be polycrystallized due to the heating. The same may occur when the energy beam is applied after forming the impurity layers 22, 23 and 32 by exposing the impurity layers 22, 23 and 32 to the ionized gas $G_3$ in FIG. 9A. This is because the impurity layers 22, 23 and 32 are directly heated and thus the temperature thereof rises while the conduction regions 21 and 31 are indirectly heated with the control electrodes 26 and 33 in between. With this operation, the memory device related to the present embodiment is formed.

The memory device as described above possesses the same operation and effects as those of the first embodiment, and is integrated in the same manner as in the case of the first embodiment. Though not described in detail in the present embodiment, the memory device related to the present embodiment is configured in the same manner as in the case of the second embodiment.

(Fourth Embodiment)

Figure 13:
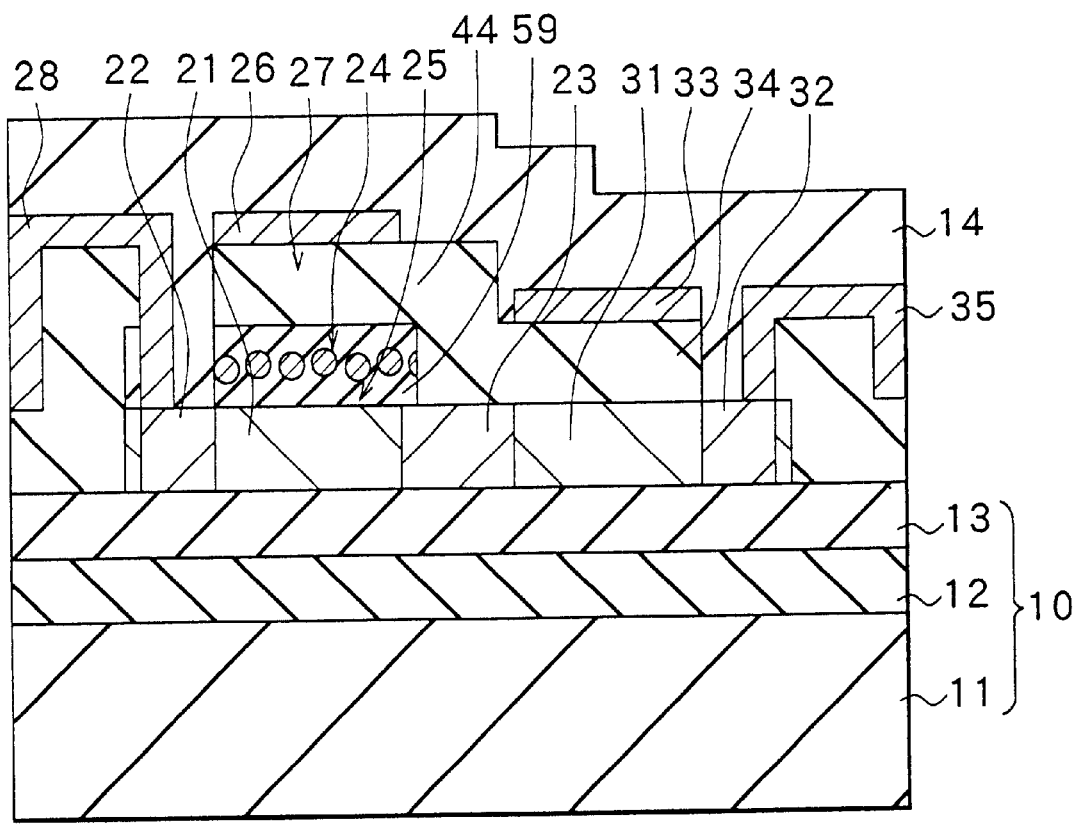
FIG. 13 is a cross-sectional view showing the configuration of the memory device relating to a fourth embodiment according to the present invention.

FIG. 13 shows a configuration of a memory device related to a fourth embodiment. This memory device possesses the same configuration as in the case of the first embodiment except that the storage region 24 is formed in a storage region forming film 59. Consequently, like component devices are given like reference numerals, and the detailed descriptions thereof are omitted.

The storage region forming film 59 is formed on the conduction region 21 opposite to the silicon dioxide layer 13. A part of the storage region forming film 59, that is, the region between the storage region 24 formed inside the storage region forming film 59 and the conduction region 21 is the tunnel insulating film 25. On the storage region forming film 59, a control electrode 26 is formed opposite to the conduction region 21 with an insulating film 44 in between. The storage region forming film 59 and the insulating film 44 between the storage region 24 and the control electrode 26 constitutes the insulating film 27.

The memory device that has this kind of configuration is manufactured as follows.

Figure 15:
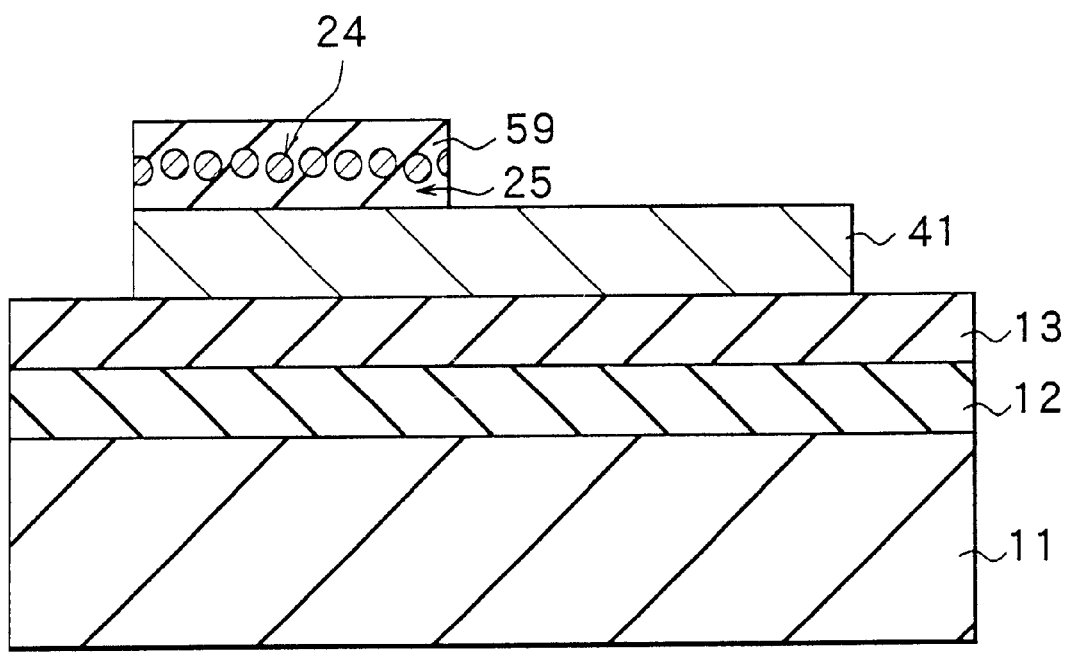
FIG. 15 is a cross-sectional view showing a manufacturing step following those of FIGS. 14A and 14B.

FIGS. 14A and 14B, and FIG. 15 show the manufacturing steps. First of all, as shown in FIG. 14A, a substrate 11 made of quartz glass, for example, is prepared as in the case of the first embodiment. Then, the silicon nitride layer 12, the silicon dioxide layer 13, and the semiconductor layer 41 that constitutes the conduction regions 21 and 31 are stacked thereon successively. On the semiconductor layer 41, a nonstoichiometric film 61 made of oxide ($SiO_x(x<2)$) of nonstoichiometric composition containing silicon in excess is formed by CVD or sputtering, for example.

Next, as shown in FIG. 14B, the surface of the nonstoichiometric film 61 is irradiated with energy beam E absorbed by the semiconductor layer 41, for example, to heat the nonstoichiometric film 61. With this operation, the oxide from which the nonstoichiometric film 61 is formed decomposes into silicon dioxide and silicon of the stoichiometric composition. In other words, the nonstoichiometric film 61 becomes a storage region forming film 59 which has a plurality of particulates 59a made of silicon dispersed therein.

Examples of the energy beam E are eximer laser beam and electron beam. The wavelength of eximer laser beam may be 308 nm for XeCl, 248 nm for KrF, or 193 nm for ArF, for example.

After forming the storage region forming film 59, as shown in FIG. 15, by etching using ionized gas such as sulfur hexafluoride or carbon tetrafluoride, etc., the storage region forming film 59 and the semiconductor layer 41 are selectively removed, and thus the device is separated. Thereafter, by etching using mixture gas of carbon tetrafluoride and hydrogen, for example, the storage region forming film 59 is selectively removed except for the region corresponding to the region planned to be formed into the conduction region 21. With this operation, the storage region 24 comprising particulates 59b and a tunnel insulating film 25 comprising a silicon dioxide film 59a are formed.

After forming the storage region 24 and the tunnel insulating film 25, the insulating film 44 is formed as in the case of the first embodiment (see FIG. 5A), and the surface is exposed to the atmosphere of ionized gas G2 containing hydrogen atoms (see FIG. 5B). Thereafter, as in the case of the first embodiment, the control electrodes 26 and 33 are selectively formed (see FIG. 6A), and impurities are added to the semiconductor layer 41. Thus, the impurity regions 22, 23 and 32, and the conduction regions 21 and 31 are formed (see FIG. 6B or FIG. 9A).

After adding impurities, as in the case of the first embodiment, the impurities are activated and the source electrode 28 and the drain electrode 35 are selectively formed (see FIG. 7 or FIG. 9B). Thereafter, the protection film 14 is formed. With this operation, the memory device shown in FIG. 13 is formed.

The memory devices of this kind operate and are integrated as in the case of the first embodiment. According to the method for manufacturing a memory device related to the present embodiment, the nonstoichiometric film 61 of the nonstoichiometric composition containing silicon in excess is formed, and by heating this, the storage region 24 is formed. As a result, the memory device related to the present embodiment is easily manufactured, and the memory device related to the present embodiment can be easily achieved.

In the present embodiment, the nonstoichiometric film 61 is formed from oxides containing silicon in excess. When the storage region comprises particulates of germanium, the nonstoichiometric film may be formed from oxides containing germanium in excess. When the storage region comprises particulates of silicon germanium, the nonstoichiometric film may be formed from oxides containing silicon and germanium in excess. The memory device related to the present embodiment may be configured in the same manner as in the case of the second and the third embodiments.

The present invention has been described in its preferred embodiments. It is to be understood that the present invention should not be limited to these embodiments, but may be changed and modified in various ways. For example, in each embodiment described above, the substrate 11 is formed from quartz glass. However, the substrate 11 may be made of other insulators with a low-melting point such as silicate glass and plastics In each of the above embodiments, the base portion 10 is formed by successively stacking the silicon nitride layer 12 and the silicon dioxide layer 13 on the substrate 11. However, the base portion may be formed through forming either the silicon nitride layer 12 or the silicon dioxide layer 13 on the substrate 11. The base portion may be also formed through forming the silicon oxide nitride layer on the substrate 11. In addition, the base portion may be anything as long as it can serve as a base for forming the memory transistor 20 and the selection transistor 30. An example of the base portion is an insulating film formed on a suitable substrate with other semiconductor device in between.

Moreover, in each of the embodiments mentioned above, the conduction regions 21 and 31, and the impurity regions 22, 23 and 32 are made of polycrystal silicon or amorphous silicon. They may also be made of other non-single crystal silicon such as a complex of polycrystal silicon and amorphous silicon.

In addition, in each of the embodiments mentioned above, the conduction regions 21 and 31, and the impurity regions 22, 23 and 32 are made of silicon. They may also be made of germanium or silicon germanium. They may also be made of compound semiconductors such as gallium arsenide (GaAs).

Furthermore, in each of the embodiments mentioned above, the storage region 24 comprises fine semiconductor particles. It may also comprise particulates made of metals such as aluminum, copper, or tungsten (W). In such event, the storage region 24 is formed by covering the surface of the tunnel insulating film 25 at a coverage factor smaller than 1 by deposition.

In addition, in each of the embodiments mentioned above, the tunnel insulating film 25 is made of the oxide film. The tunnel insulating film 25 may also be made of nitride film or oxide nitride film. When the tunnel insulating film 25 is made of the nitride film, for example, it is formed by exposing the surface in the ionized gas containing nitrogen atoms (N) generated by introducing ammonia ($NH_3$) or nitrogen ($N_2$) into the AC electromagnetic field. When the tunnel insulating film 25 is made of the oxide nitride film, it is formed by exposing the surface in the ionized gas containing the oxygen atoms and nitrogen atoms generated by introducing dinitrogen monoxide ($N_2O$) into the AC electromagnetic field.

Furthermore, in each of the embodiments mentioned above, when the tunnel insulating film 25 is formed, the energy beam is applied to heat the film so that the film quality is improved. However, any other method may be employed for heating the tunnel insulating film 25.

Also, in the fourth embodiment, the nonstoichiometric film 61 is irradiated with the energy beam to heat the film. However, any other method may be employed for heating the tunnel insulating film 25.

As described above, according to the memory devices of the present invention, the storage region comprising pluralities of dispersed particulates is to be provided. Therefore, it is possible to prevent the electrical charges accumulated in particulates of the storage region in non-defect region from leaking even when the tunnel insulating film is formed at low temperatures. As a result, information can be stored over a long period of time and at the same time, the base portion can be made of inexpensive materials with a low melting point, glass, for example. The memory devices of the present invention are further provided with the conduction region for selection and the control electrode for selection. Thus the memory devices with which information can be selectively written, erased, and read out can be easily formed on one surface of the base portion made of glass, etc.

According to the method for manufacturing a memory device of the present invention, the storage region comprising a plurality of particulates dispersed on the tunnel insulating film is formed. As a result, the memory device related to the present invention is easily manufactured and realized In particular, according to the method for manufacturing a memory device of one aspect of the present invention, the tunnel insulating film is formed through being exposed to the ionized gas containing at least one of the oxygen atoms and the nitrogen atoms. Thereby, the tunnel insulating film is formed at low temperatures. As a result, it is possible to form the base portion from an inexpensive material with a low melting point such as glass or plastics.

Furthermore, according to the method for manufacturing a memory device of one aspect of the present invention, the tunnel insulating film is irradiated with the energy beam after forming the tunnel insulating film. As a result, it becomes possible to reduce defects at the tunnel insulating film and at the interface between the tunnel insulating film and the conduction region for memory without raising temperature of the base portion. Accordingly, information is able to be stored over a long period of time with stability even if the memory device is manufactured at low temperatures.

In addition, according to the integrated circuit of the present invention, the memory devices of the present invention are integrated. Therefore, the memory devices are integrated on the base portion made of glass, etc.

Obviously many modifications and variations of the present invention are possible in the light of the above teachings. It is therefore to be understood that within the scope of the appended claims the invention may be practiced otherwise than as specifically described.

What is claimed is:

1. A method for manufacturing a memory device comprising the steps of:

forming a conduction region for memory and a conduction region for selection made of semiconductors on a base portion made of an insulator;

forming a tunnel insulating film on the conduction region for memory;

forming a storage region comprising a plurality of particulates dispersed on the tunnel insulating film;

forming an insulating film for controlling memory on the storage region while forming an insulating film for controlling selection on the conduction region for selection;

forming a control electrode for memory on the insulating film for controlling memory while forming a control electrode for selection on the insulating film for controlling selection; and forming a first impurity region adjacent to the conduction region for memory, a second impurity region separated from the first impurity region and adjacent to the conduction region for memory and to the conduction region for selection, and a third impurity region separated from the second impurity region and adjacent to the conduction region for selection.

2. The method for manufacturing a memory device according to claim 1, wherein the tunnel insulating film is formed on the conduction region for memory by exposing the surface of the conduction region for memory to the ionized gas containing at least one of an oxygen atom (O) and a nitrogen atom (N).

3. The method for manufacturing a memory device according to claim 2, further comprising a step of heating the surface of the conduction region for memory after forming the tunnel insulating film.

4. The method for manufacturing a memory device according to claim 3, wherein the surface of the conduction region for memory is heated by irradiation with energy beam.

5. The method for manufacturing a memory device according to claim 1, where in the storage region is formed by covering the surface of the tunnel insulating film at a coverage factor smaller than 1 by any of vapor phase epitaxy, sputtering, and vapor deposition.

6. The method for manufacturing a memory device according to claim 1, wherein the tunnel insulating film and the storage region are formed by forming a nonstoichiometric film of nonstoichiometric composition containing the semiconductor element in excess on the conduction region for memory and heating the nonstoichiometric film.

7. The method for manufacturing a memory device according to claim 6, wherein the nonstroichiometric film is heated by irradiation with energy beam.

* * * * *